United States Patent [19]
Hsieh et al.

[11] Patent Number: 5,506,815
[45] Date of Patent: Apr. 9, 1996

[54] RECONFIGURABLE MULTI-USER BUFFER MEMORY PARTICULARLY FOR SIGNAL PROCESSING SYSTEM

[75] Inventors: Yung-Ching Hsieh; Yin H. Lieu, both of Hsinchu, Taiwan

[73] Assignee: Etron Technology Inc., Hsinchu, Taiwan

[21] Appl. No.: 374,991

[22] Filed: Jan. 19, 1995

[51] Int. Cl.[6] .................................. G11C 7/00; G11C 8/00
[52] U.S. Cl. ........................... 365/230.03; 365/230.02; 365/230.05; 365/189.02
[58] Field of Search ..................... 365/230.03, 189.02, 365/230.02, 230.05, 189.04

[56] References Cited

U.S. PATENT DOCUMENTS

| | | | |
|---|---|---|---|
| 5,060,145 | 10/1991 | Scheuneman | 365/230.05 |
| 5,119,498 | 6/1992 | McNeill et al. | 395/800 |
| 5,175,831 | 12/1992 | Kumar | 395/425 |
| 5,202,856 | 4/1993 | Glider | 365/230.05 |
| 5,265,063 | 11/1993 | Kogure | 365/230.03 |
| 5,269,015 | 12/1993 | Shires | 365/230.05 |
| 5,274,780 | 12/1993 | Nakao | 395/325 |
| 5,375,089 | 12/1994 | Lo | 365/189.04 |

*Primary Examiner*—David C. Nelms
*Assistant Examiner*—Son Mai
*Attorney, Agent, or Firm*—Goerge O. Saile; William S. Robertson

[57] ABSTRACT

A buffer memory system provides independent memory blocks, each with independent addressing and data paths, for a processor and input and output devices. The processor can configure the data paths so that an input device can initially supply data to a first memory block. The processor can then assign a second block for input and operate on the data in the first block. The processor can store the results of the process in a third block that has been assigned to an output device. The memory blocks and the associated data paths can paired for operating with a processor with a wider data bus.

13 Claims, 2 Drawing Sheets

RECONFIGURABLE MULTI-USER BUFFER MEMORY PARTICULARLY FOR SIGNAL PROCESSING SYSTEM

FIELD OF THE INVENTION

This invention relates generally to buffer memory systems and more specifically to a buffer memory system that is particularly useful for handling data transfers between a microprocessor and peripheral devices for processing an analog signal.

INTRODUCTION

Processing an analog signal is a specific example of jobs this data processing system can do. An external source generates an analog signal, and an analog to digital converter converts the signal to digital form and stores it in the memory of the data processing system. A processor operates on this data and stores the result in the memory. The result can be used in various ways, but in some applications it is fetched from the memory and converted to a new analog signal.

When systems of this type run in real time, it is conventional to provide separate input and output memories. A series of digitized analog codes is stored in the input memory and the corresponding result codes are fetched from the output memory.

SUMMARY OF THE INVENTION

One object of this invention is to provide a new and improved buffer memory that permits simultaneous access by several users. In the specific system that will be described later, the users are an analog to digital converter (ADC) that stores a time series of digital codes in the memory, a processor that operates on the data, and a digital to analog converter (DAC) that converts the data in the memory to a transformed analog signal.

This invention provides an improved architecture for the system of the prior art with separate memory blocks for input and output.

Other objects and features of the invention will appear in the description of a preferred embodiment of the invention.

THE DRAWING

THE PREFERRED EMBODIMENT—FIG. 1

The Signal Processing System

Figure 1:
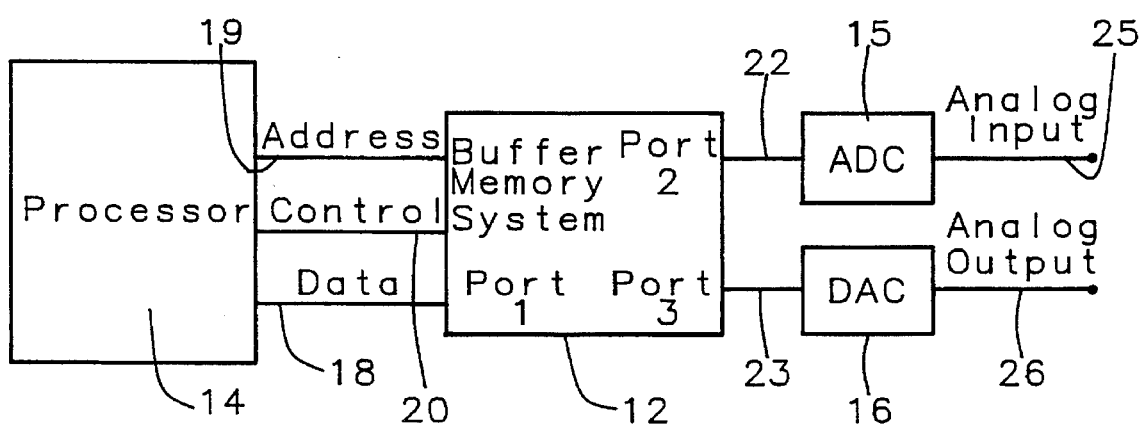
FIG. 1 is a block diagram of the buffer memory of this invention and some associated components.
Figure 2:
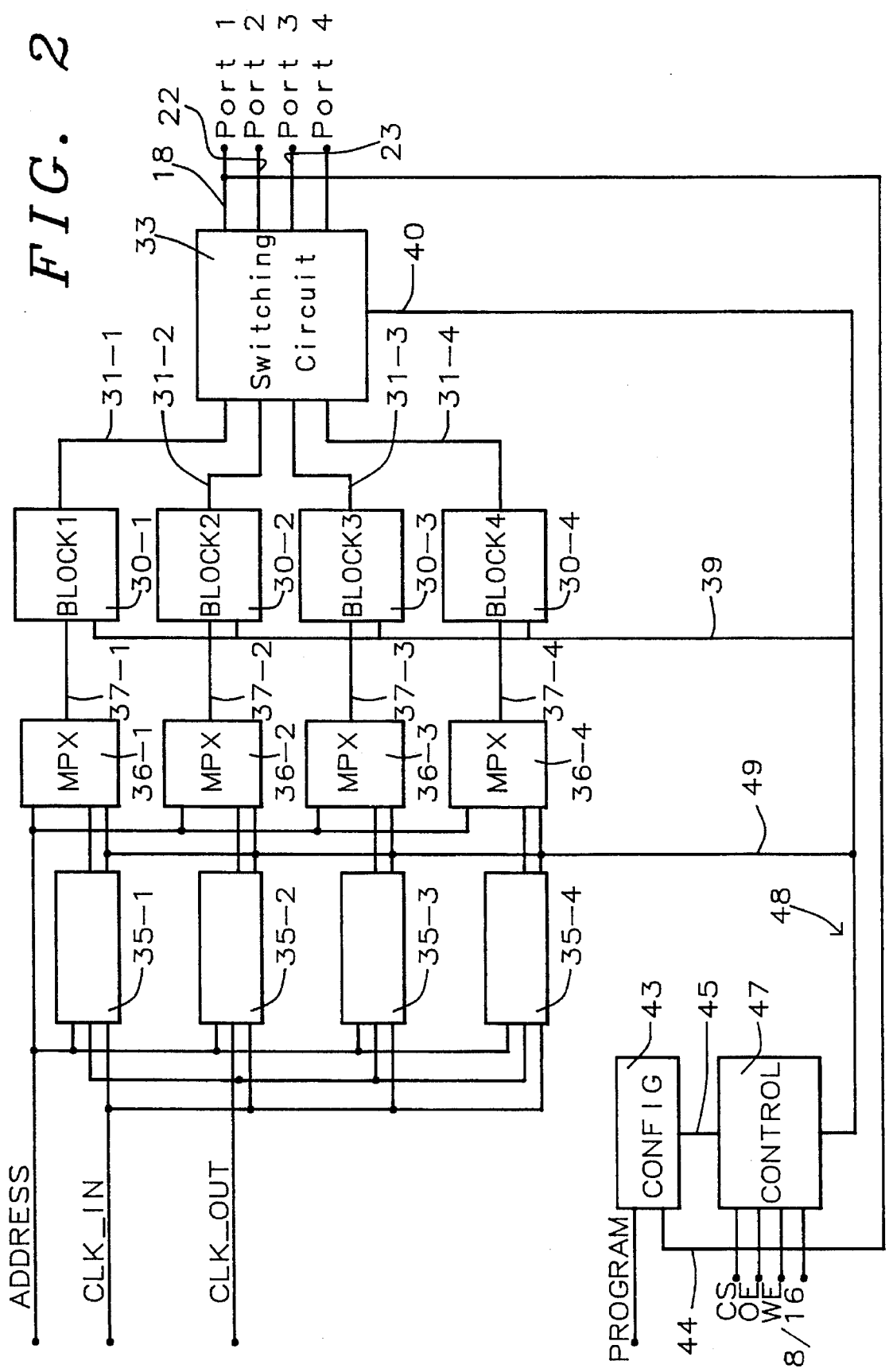
FIG. 2 is a block diagram of the buffer memory of FIG. 1.

FIG. 1 shows the new buffer memory system 12 in a block diagram form with connections to a processor 14, usually a microprocessor, an analog to digital converter (ADC) 15, and a digital to analog converter (DAC) 16. In the form shown in FIG. 1, the buffer memory has three data ports: Port 1, Port 2 and Port 3. (In FIG. 2 a fourth port, Port 4, is shown.) From a more general standpoint, the ADC 15 and DAC 16 are a plurality of peripheral devices that exchange data with processor 14 through buffer memory system 12 for processing any kind of signal.

Each memory port provides a connection for a bidirectional multi-bit bus that carries data to buffer system 12 on a store operation and carries data from the buffer system on a fetch operation. A data bus 18 interconnects the processor 14 and an associated port. A multi-line address bus 19 carries a memory address from the processor to the buffer system, and a control bus 20 carries memory control signals from the processor to the buffer system. The architecture for many processors includes a data bus, an address bus and a control bus, and the structure of busses 18, 19 and 20 are conventional and the related operations of processor 14 are conventional except as will be explained later.

ADC 15 receives an analog signal on a line 25 and it produces a sequence of multi-bit digital signals on a data bus 22 that interconnects the ADC and Port 2. Data bus 22 may be bidirectional for generality, but in the operations that will be described data flows only from the ADC to Port 2.

A data bus 23 interconnects DAC 16 and Port 3. As part of a signal processing operation, a series of multi-bit output data units appears at Port 3 and on bus 23. DAC 16 converts these units to a corresponding analog signal at an analog output 26. Data bus 23 may be bidirectional for generality, but in the operations that will be described data flows on bus 23 only from Port 3 to DAC 16. Other connections between ADC 15 and DAC 16 and the buffer memory 12 will be described later.

These connections between the buffer system and its users 14, 15, 16 are made in any suitable way. In contrast to programmable connections that will be described later, these connections are not changed during the buffer system operations that will be described.

THE PREFERRED EMBODIMENT—FIG. 2

Introduction

First consider the components that were introduced in FIG. 1. On the right in the drawing, the buffer memory has the three input/output ports shown in FIG. 1 and an additional port, Port 4. On the left, the address bus 19 is shown in the same form as in FIG. 1. The other lines on the left are part of the control bus 20, as will be described later.

The Memory Blocks

The preferred buffer memory system has four memory units 30 that will be called memory blocks (or blocks) and are designated Block 1, Block 2, Block 3 and Block 4. In the drawing, the memory blocks and associated components have a reference character with a numeral suffix, for example 30-1 for Port 1. These components will be referred to with the full reference character (i.e. including the suffix) to identify a specific component, and they will be referred to with the reference character but without the suffix to indicate one component or several components of the group generally.

Each memory block 30 is independently addressable (in contrast to a memory having address blocks dedicated to particular users and having a single addressing circuit that is shared by the users). Preferably blocks 30 are identical in capacity and in memory word width so that they can be configured easily to different sizes, as will be explained later.

In the preferred embodiment, each memory block has a capacity of 16,384 (16 K) words and each word has 8 bits. Each memory block has a data bus 31 of the corresponding width, 8 bits. The four memory data busses 31 are each connected to the associated port through a logic circuit 33 that will be described later.

Configuration—Introduction

The buffer system can be operated in six different modes that will be identified by three-bit binary numbers 000 to 111, as Table I shows.

TABLE I

| Code | Meaning |
|------|---------|
| 000 | 8-bit asynchronous mode |
| 001 | 8-bit synchronous write mode |
| 010 | 8-bit synchronous read mode |
| 011 | reserved |
| 100 | 16-bit asynchronous mode |
| 101 | 16-bit synchronous write mode |
| 110 | 16-bit synchronous read mode |
| 111 | reserved |

It will be convenient to first continue the description of the memory blocks and the ports with an introductory reference to these modes, then to take up the storage and addressing components of the buffer system, and then to consider the components that form the configuration control codes and the operations that the buffer system can perform with the different modes.

The Switching Logic Circuit

A switching logic circuit 33 interconnects memory block data buses 31 and the input/output ports in response to signals on a bus 40. These signals will be described later, and they also configure the buffer system for use with busses 18, 22, 23 that are either 8 bits wide or 16 bits wide (as explained later).

Switching circuit 33 provides a programmable connection between the memory blocks and the buffer system ports. (The suffixes for busses 31 do not have to match the suffixes of the ports.) In the 8 bit word configuration, each memory block bus 31 is connected to a different one of the ports in any selected configuration.

The preferred implementation of switching logic circuit 33 interconnects the blocks and ports in all possible configurations. The circuit is similar to multiplexor circuits 36. Each block 30 has an 8-bit bidirectional path to each of the four ports. Each line of an 8-bit path has a bidirectional gate. The gates in the same path receive a common control signal to enable a unique 8-bit bidirectional path between each block and its associated port.

Alternatively, if only a few of the possible configurations will be useful and the number of gates and the number of control lines will be reduced from the general case. For example, some gates and control lines can be eliminated if Block 4 is used only in the 16-bit mode; some gates and control lines can be eliminated if input devices and output devices access different blocks.

Pairs of blocks can be operated together to provide a memory word of 16 bits. In this configuration, pairs of 8 bit busses in the switching circuit 33 are paired to form a 16 bit bus or are replaced by an equivalent 16-bit bus. The logic gates for the 16-bit mode are a subset of the gates for the 8-bit mode just described. For example, eight 8-bit buses connect memory buses 31-1 and 31-2 to the four ports for the 8-bit configuration. For the 16 bit configuration, the connections between bus 31-1 and port 1 and between bus 31-2 and Port 2 are paired. Consequently the 8-bit busses between bus 31-1 and Port 2 and between bus 31-2 and Port 1 are not used. A similar pattern connects busses 31-1 and 31-2 to Port 3 and Port 4, and the pattern for busses 31-3 and 31-4 is similar.

Block Addressing

Each memory block 30 has an address counter 35. The address bus 19 is connected to supply the address from the processor to initialize each counter 35. Operations to increment counters 35 are controlled by signals CLK_IN and CLK_OUT on lines of control bus 20. Line CLK_IN is connected to receive an incrementing signal from the input/output device that supplies data to a memory block, ADC 15 in the system of FIG. 1. Similarly, line CLK_OUT is connected to carry incrementing signals from an output device, DAC 16 in FIG. 1.

A multiplex circuit 36 (MPX) and an address bus 37 for each memory block cooperate to connect the associated memory block to receive an address from either address bus 19 or the associated address counter 35. Each multiplex circuit receives a control signal 49 (explained later) that controls this selection.

When pairs of blocks 30 are operated together for a 16-bit memory word, each block of a pair responds to the same address, either from address bus 19 or from the two paired address counters. This arrangement provides a simple relationship between the data in the two memory modes.

The Configuration Register

The four memory blocks 30 require twelve configuration bits (three for each block, as in Table I). A configuration register 43 is preferably 8 bits wide, a standard width but not enough to hold all twelve configuration bits. The configuration register 43 holds two configuration bits for each memory block, the synchronous/asynchronous bit and the read/write bit. Such a two bit set is commonly called a field.

The remaining configuration bit, $8/16$, is supplied by the processor on a single line. (The entire buffer system is in 8 bit mode or 16 bit mode.) The processor has sufficient internal registers and connection points for this line. A bus 44 connects the configuration register to be loaded from the processor and the signal Program (one bit) is raised to enable the configuration register to store the 8-bit code on bus 44. Preferably, bus 44 is connected to the processor/memory data bus 18 at Port 1. Note that configuration register 43 is loaded only from the processor and not from the peripheral units.

The processor loads all eight bits of register 43, regardless of how many fields are changed. Accordingly, the processor has an 8-bit internal register that is first modified when a new configuration is to be written into register 43. This register may be a dedicated hardware register or the location in storage assigned to a variable in a program for holding the configuration of the buffer system. The program is normally held in processor memory (and not in the blocks of the buffer system). Some programming languages provide support for writing programs of this type or the program can be written in the assembly language of processor 14 or directly in machine language.

The Contril Circuit

A control circuit 47 receives the contents of the configuration register on an 8-bit bus 45 and the $8/16$ configuration bit from the processor 14 and thus has the 3 bit configuration code shown in Table I for each block. Control circuit 47 also receives three memory control signals from the processor, chip select CS, output enable OE and write enable WE. A multi-line bus 48 distributes these signals on three branches 40, 49, and 39. The implementation of logic for circuit 47 and the associated busses will be readily understood from the description of the logic functions.

In one binary state, signal CS (chip select) enables the memory block which is connected to the CPU port (as established in Switching Circuit 33) to operate in response to other signals and in the complementary state it prevents this memory block from responding to these signals. This signal can be used to prevent the input/output devices from accessing memory while it is being reconfigured. Control line CS does not otherwise control the memory blocks which are connected to an input port (ADC) or an output port (DAC), and these memory blocks are free run after the configuration process has been finished. (In a conventional memory, CS controls the whole chip.)

Recall that the input and output ports and the associated busses 25, 26 are permanent (until the system is physically reconfigured) but the connections to particular blocks 30 can be changed by the processor as a signal processing operation proceeds. The blocks that handle input and output devices are defined by codes for the synchronous state (codes 001, 010, 101, 110) in the corresponding fields of the configuration register, and this bit pattern is used in Control Circuit 47 to inhibit transmitting signal CS to these blocks. More specifically, an individual line CS in bus 39 to each block is inhibited if the corresponding bit pattern in the configuration register identifies the block as being in use at the moment by an input/output device such as 15, 16.

Control line OE (output enable) carries a binary signal. In one binary state it inhibits output operations and in the other state it permits these operations.

Signal WE (write enable) enables a store (write) operation in one binary state and a fetch (read) operation in the complement state. This signal is familiar from other memories, but in this invention it controls only the memory block that is connected to the CPU port (Port 1 in FIG. 1). The Control Circuit 47 and the busses are implemented in the way described for signal CS.

Control Logic circuit 47 also produces signals on a bus 49 which carries individual signals to the address counters 35, the multiplexors 36, the memory blocks 30 and the switching circuit 33.

An 8-Bit Memory Word Operation

The processor first sends a configuration word to configuration register 43 on bus 44 to configure each memory block. For example, suppose Block 1 is configured as asynchronous mode, Block 2 as synchronous write, Block 3 as synchronous read and Block 4 as idle (using a reserved code for example).

When the system is in this configuration, the switching logic will connect bus 31-1 to port 1, bus 31-2 to port 2, and bus 31-3 to port 3. In response to signals on bus 49, MPX 37-1 will select address bus 19, and MPX 37-2 and MPX 37-3 will select address counters 35-2 and 35-3 respectively.

Processor 14 sends the initial address to the corresponding address counter 35 to initialize the addresses. These addresses are known to a compiler or linker that assigns addresses to variables in the programs run by processor 14 and they are supplied to the corresponding program statements when the program is compiled or assembled or loaded.

When processor finished the above actions, it can access memory Block 1 at any time. Block 2 and Block 3 are free to run for fetch or store operations (as established by a their configuration bits) according to the addresses, which are incremented in response to CLK_IN (block 2) and CLK_OUT (block 3).

At any time, processor can reconfigure each memory block by sending a new configuration word to configuration register 43. Such a reconfiguration might switch input device 15 to load a different memory block which had been cleared by an operation under the previous configuration, and ordinarily its new address register would be reset to an appropriate starting value. Device 15 itself is not affected by the configuration change. The reconfiguration would similarly change a block for output device 16 but would be apparent to this device.

A 16-Bit Memory Word Operation

If a signal processing system uses a 16 bit processor, the buffer system can provide a 16 bit operation mode. To switch from 8 bit to 16 bit, the control signal 8/16 must be changed from state 0 to state 1. In 16 bit mode, memory Block 1 and Block 2 are operated as a pair, Block 3 and Block 4 are operated as another pair. The corresponding data ports, port 1 and port 2 are operated as a pair, the port 3 and port 4 are operated as another pair. Assume that port 1 and 2 are connected to a 16 bit processor, port 3 and 4 are connected to a 16 bit input peripheral circuit such as ADC. The buffer memory is started up as follows.

Processor 14 sends a configuration word to configure the memory blocks. For this example, assume that Block 1 and Block 2 are configured to synchronous write mode, Block 3 and Block 4 are configured to asynchronous mode. In this configuration the switching logic will connect bus 31-1 to Port 3, bus 31-2 to Port 4, bus 31-3 to Port 1 and bus 31-4 to Port 2. Because Block 1 and Block 2 are in synchronous write mode, the MPX 36-1 and MPX 36-2 will select the address from address counters 35-1 and 35-2 respectively in response to individual lines in bus 49. Because Block 3 and Block 4 are in asynchronous mode, MPX 36-3 and MPX 36-4 will select address from the address bus 19 (in response to individual lines in bus 49). The processor sends the initial address to the address counters 35-1 and 35-2. When processor 14 has finished these steps, it can access memory Block 3 and Block 4 at any time. Block 1 and Block 2 are free to run and are controlled by the control signal CLK_IN. The processor can reconfigure memory blocks at any given time by sending a new configuration word.

Other Embodiments

From a more general standpoint the ADC and DAC represent two devices that access the memory directly (and not through registers of the processor) and independently (and not through shared busses and address registers). A variety of applications exist for such a memory, as the general term "signal processing" suggests. Those skilled in the art will recognize appropriate modifications of the preferred embodiment, within the spirit of the invention and the intended scope of the claims.

We claim:

1. A buffer memory system to be shared by a plurality of users, including a processor (14) and other users such as an input device (15) and an output device (16), the buffer memory system comprising, a plurality of memory blocks (31), each block having the same predetermined memory word width and the same number of words, configuration means (43, 47) responsive to the processor for providing signals (48) for selectively assigning the memory blocks to said users, means (33) controllable by the processor for connecting each memory block to a selected user for data transfer, an address bus (19) connectable to the processor for carrying an address from the processor, an address counter (35) for each memory block, means (49) controlling a selected address counter to store the address on the address bus for setting the selected address counter to an initial value supplied by the processor, the initial value pointing to a memory location where a sequence of memory access operations by one of said other users (15, 16) is to start, a multiplexor (36) for each memory block responsive to a signal (49) from the processor for connecting the associated memory block to receive an address from the associated address counter for use of the memory block by one of said other users or to receive an address from the address bus for use of the memory block by the processor, means (CLK IN, CLK OUT) individual to each of said other users for carrying a signal to advance an address counter as the memory access operations of the user proceed, and means (49) directing each said signal to the address counter of the user, whereby the buffer memory system configuration can be changed as data supplied by an input device user is processed by the processor and the results are transferred to an output user.

2. The buffer memory system of claim 1 wherein the means (33) for connecting each block to a selected user comprises a programmable switch that establishes a path between each user and a unique memory block according to a signal from the processor.

3. The buffer memory system of claim 2 wherein each memory block has a predetermined data width and the programmable switch means (33) includes a data path for each memory block of said predetermined data width.

4. The buffer memory system of claim 3 wherein said users are connected to the programmable switch means means (33) for connecting each memory block to a selected user throughout an operation in which the users may be connected to different memory blocks and the means for connecting each block to a selected user comprises switching means responsive to a signal from the processor for interconnecting a user and a selected memory block.

5. The buffer memory system of claim 4 wherein the switching means (33) includes means for operating blocks and busses in pairs corresponding to users having a data path that is twice the width of a memory block.

6. The buffer memory system of claim 3 wherein the configuration means (43, 47) comprises a register holding a multi-bit field for each memory block.

7. The buffer memory system of claim 6 wherein a first bit of each multi-bit field establishes block access operations from the the address bus in one binary state and access operations that are synchronous with an address counter in the other state.

8. The buffer memory system of claim 7 wherein a second bit of each multi-bit field is operable when the associated first bit establishes an operation from the address bus to establish in one binary state a memory block read operation and in the other binary state a memory block write operation.

9. The buffer memory system of claim 6 wherein the configuration means includes a logic circuit (47) responsive to the configuration means register for producing signals for controlling the switching means and the multiplex means.

10. The buffer memory system of claim 9 wherein the logic circuit includes means for transmitting memory controlling signals from the processor to memory blocks made accessible to the processor by the operation of the switching means (33).

11. The buffer memory system of claim 10 wherein one of said memory signals enables a write operation in one binary state and inhibits a write operation in its other binary state.

12. The buffer memory system of claim 10 wherein the means for setting an initial value into a selected address counter comprises logic means responsive to the configuration register for connecting a selected address counter to the address bus.

13. A buffer memory system for a plurality of users, the users including a processor and at least one peripheral device, the buffer memory system comprising, at least one memory block for each user, each memory block having the same predetermined memory word width and the same number of words, switching means for connecting each block for access by any one user at a time, the switching means providing simultaneous connections between each block and its one user, and means in the switching means responsive to a signal from the processor for establishing a selected interconnection pattern, an address counter for each memory block and multiplex means responsive to a signal from the processor for selectively connecting a memory block to receive an address from the counter for memory access by a peripheral device or from the processor for memory access by the processor, means for loading an address counter with an initial value point to a memory location where a sequence of memory access operations by one of said other users is to start, a configuration register connected to receive from the processor a multi-bit configuration code for each memory block and a logic circuit for supplying signals to control the switching means and the multiplex means according to the contents of the configuration register, and means individual to each of said other users for carrying a signal to advance an address counter as the memory access operations of the user proceed, and means directing each said signal to the address counter of the user.

\* \* \* \* \*